United States Patent
Kim (10) Patent No.: US 7,224,179 B2
(45) Date of Patent: May 29, 2007

(54) APPARATUS FOR ADJUSTING SLEW RATE IN SEMICONDUCTOR MEMORY DEVICE AND METHOD THEREFOR

(75) Inventor: Yong-Ki Kim, Ichon-shi (KR)

(73) Assignee: Hynix Semiconductor, Inc., Ichon-shi (KR)

(*) Notice: Subject to any disclaimer, the term of this patent is extended or adjusted under 35 U.S.C. 154(b) by 86 days.

(21) Appl. No.: 11/016,528

(22) Filed: Dec. 17, 2004

(65) Prior Publication Data

US 2005/0135168 A1 Jun. 23, 2005

(30) Foreign Application Priority Data

Dec. 19, 2003 (KR) .................. 10-2003-0093702
Apr. 1, 2004 (KR) .................. 10-2004-0022541

(51) Int. Cl.
*H03K 17/16* (2006.01)
*H03K 19/003* (2006.01)

(52) U.S. Cl. .................. 326/26; 326/27; 326/30; 326/87

(58) Field of Classification Search ............ 326/26–27, 326/30, 87; 327/108–112, 170
See application file for complete search history.

(56) References Cited

U.S. PATENT DOCUMENTS 5,218,239 A * 6/1993 Boomer .................. 326/27
5,973,541 A * 10/1999 Rajivan et al. .............. 327/374
6,288,563 B1 * 9/2001 Muljono et al. .............. 326/27
6,430,606 B1 8/2002 Haq
6,636,069 B1 * 10/2003 Muljono .................. 326/30
2004/0076039 A1 4/2004 Chung et al.

FOREIGN PATENT DOCUMENTS

| JP | 06-237155 A | 8/1994 |
|----|-------------|--------|
| JP | 08-063136 A | 3/1996 |
| JP | 2001-016088 A | 1/2001 |
| JP | 2004-135098 A | 4/2004 |

* cited by examiner

*Primary Examiner*—Anh Q. Tran
(74) *Attorney, Agent, or Firm*—Townsend and Townsend and Crew LLP (57) ABSTRACT

The present invention relates to an apparatus for adjusting a slew rate of a data signal outputted by a signal from an external circuit in a semiconductor memory device and a method therefor. The apparatus includes: a slew rate control signal generation block for outputting a plurality of slew rate control signals through combining control codes inputted from the external circuit in response to a command signal; and a data buffer for adjusting a slew rate of a data signal inputted by using the slew rate control signals.

18 Claims, 12 Drawing Sheets

APPARATUS FOR ADJUSTING SLEW RATE IN SEMICONDUCTOR MEMORY DEVICE AND METHOD THEREFOR

BACKGROUND OF THE INVENTION

1. Field of the Invention

The present invention relates in general to semiconductor memories, and more particularly, to improved output buffer circuitry for semiconductor memories.

2. Description of Related Arts

Today's semiconductor memory devices include more than hundreds of millions of memory cells. A basic function of the semiconductor memory device is to input and output data for the purpose of writing the data on such memory cells and reading the written data. To increase speed of operation, a class of semiconductor memory device has evolved from a synchronous dynamic random access memory (SDRAM) device to a double data rate (DDR) RAM device to a DDR II RAM device. Despite this evolution, there has not been a great change in the basic operation of the semiconductor memory device such as a refresh operation for refreshing each memory cell, or data input and output (I/O) operation for transmitting data between an external circuit and an internal circuit.

The above basic and unique function will be maintained even in a next generation semiconductor memory technology aimed to write or read data in high-speed and reduce manufacturing costs.

Figure 1:
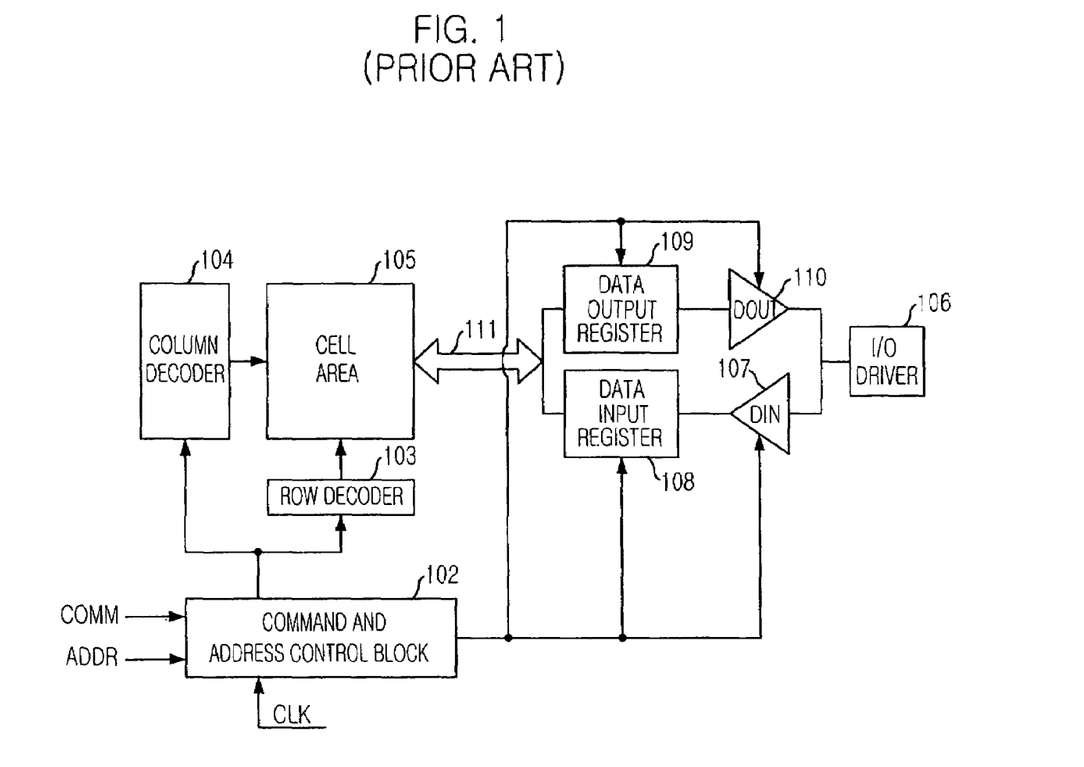
FIG. 1 is a block diagram showing a conventional semiconductor memory device.

FIG. 1 is a block diagram showing a conventional semiconductor memory device.

The semiconductor memory device includes: a command and address control circuit 102, a row decoder 103, a column decoder 104, a memory array or cell area 105, an input/output driver 106, a data input buffer 107, a data input register 108, a data output register 109, and a data output buffer 110.

The command and address control circuit 102 receives a command COMM and an address ADDR from an external circuit such as a microprocessor and transmits the address ADDR to the row decoder 103 and to the column decoder 104. Also, the command and address control circuit 102 controls the row decoder 103, the column decoder 104, the data input buffer 107, the data input register 108, the data output register 109, and the data output buffer 110 in response to the inputted command COMM.

The cell area 105 includes a plurality of memory cells for storing a data and sense amplifiers for amplifying stored data. The row decoder 103 and the column decoder 104 select a memory cell to be read and written corresponding to the command COMM and the address ADDR inputted from the external circuit. Herein, the command COMM includes a plurality of instructions responsible for a row access and a column access in operation of the DRAM device. A row address strobe (RAS) signal, a column address strobe (CAS) signal and a write enable (WE) signal are examples of such instructions. Likewise, the address ADDR includes a row address and a column address for accessing a memory cell.

Hereinafter, operation of the semiconductor memory device will be described in detail. Once the RAS signal is activated, the row address is inputted. The row decoder 103 decodes the row address, and then, a number of the memory cells corresponding to the decoded address are activated. A data having a low potential stored within the activated memory cells is amplified by the sense amplifiers of the cell area 105. The sense amplifier is ready for a write operation or a read operation after amplifying the accessed data, i.e., the data stored within the activated memory cells. That is, the sense amplifiers can serve as a data cache for temporarily storing data.

In case of a read operation, once the CAS signal is activated, the column address is decoded and the data stored into a part of the sense amplifiers serving as the data cache is outputted to an internal data bus. The outputted data is stored into the data output register 109. The data stored into the data output register 109 is outputted after a predetermined time through the data output buffer 110.

Figure 2:
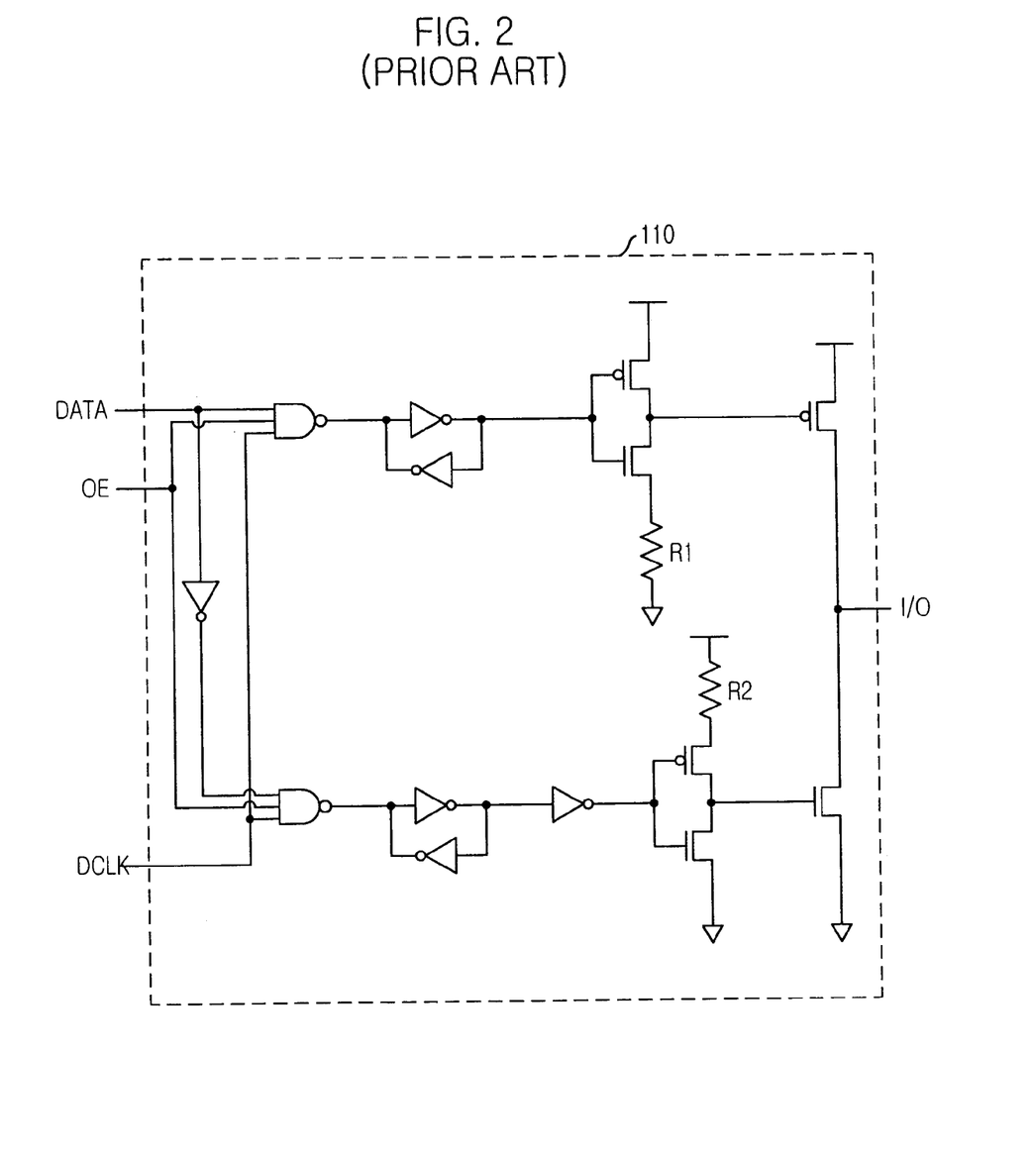
FIG. 2 is a schematic circuit diagram of a data output buffer shown in FIG. 1.

FIG. 2 is a schematic circuit diagram describing the data output buffer 110. When a data clock signal DCLK is inputted under a state that an output enable signal OE is activated, a phase of a data signal DATA is determined and then, the data signal DATA is outputted to the input/output driver 106 shown in FIG. 1. At this time, a slope of the outputted signal is called a slew rate. The slew rate is expressed with a specific unit, for instance, 3V/ns, meaning that a voltage level of a signal is activated from about 0 V to about 3 V for about 1 nanosecond. If a logic low level is about 0 V and a logic high level is about 3 V in the semiconductor memory device, it is easy to understand how long a data signal is changed from a logic low level to a logic high level.

Herein, a first resistor R1 and a second resistor R2 are a kind of passive devices for determining the slew rate. Although the slew rate can be determined by various types of devices, particularly the slew rate determined by resistors will be described in this drawing.

In a conventional design of a DRAM device, the slew rate is generally provided as a fixed value. Thus, if the slew rate is high, a quality of a signal is reduced by bounce noises, and if the slew rate is low, an access time is greatly variable, thereby resulting in the signal quality reduction. Herein, the signal quality can be regarded as a signal integrity. The signal is outputted for a predetermined period including a data generating period and a data setting period. Herein, the data generating period generally called a data window is a period for generating a voltage level of an inputted or outputted signal to be stably sensed or transmitted. The data storing period circuit a period for determining a voltage level of the inputted or outputted signal, e.g., the voltage level from a logic high to a logic low or a logic low to a logic high. Thus, a good signal integrity indicates that the data guaranteeing period is relatively longer.

Figure 3A:
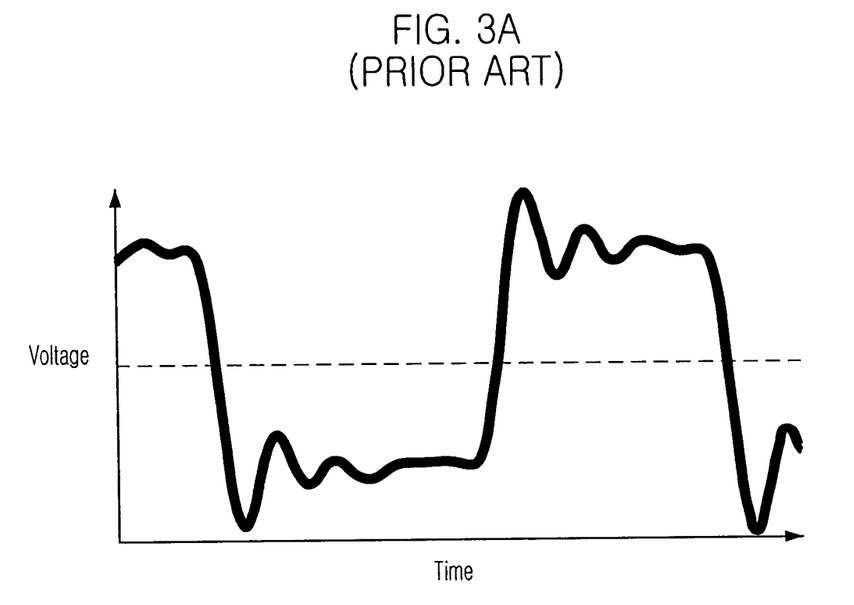
FIG. 3A is a diagram showing a waveform of a data output signal in case of an unfavorable slew rate.
Figure 3B:
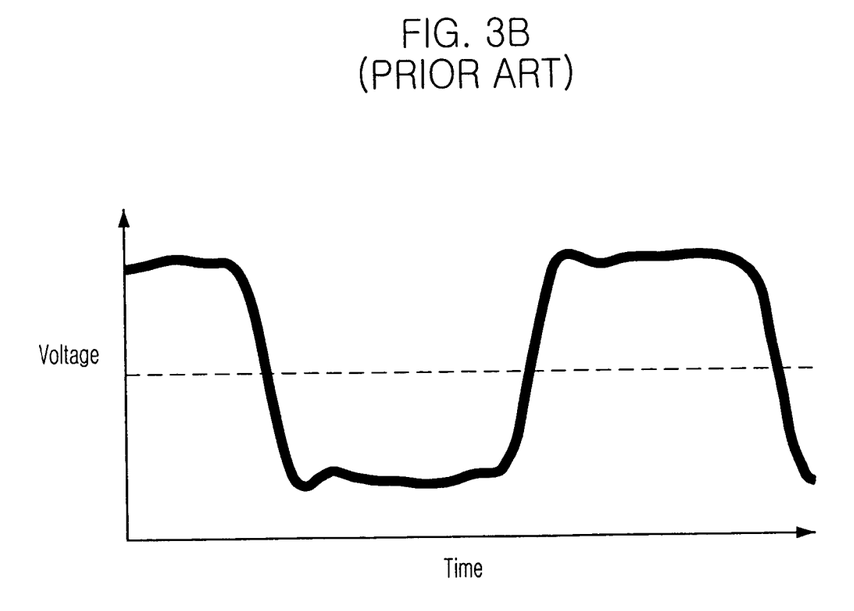
FIG. 3B is a diagram showing a waveform of a data output signal in case of a preferable slew rate.

FIG. 3A is a diagram showing a waveform of a data output signal in case of an unsuitable slew rate. As shown, the data output signal has large amounts of noises. On the other hand, FIG. 3B is a diagram showing a waveform of a data output signal in case of a preferable slew rate. As shown, the data output signal has a sufficient data window.

However, since the slew rate is provided as the fixed value when a DRAM device is designed and manufactured, it is impossible to adjust the slew rate in the DRAM device according to a generation speed, a power level and so on.

BRIEF SUMMARY OF THE INVENTION

The present invention provides an apparatus for adjusting a slew rate of a data signal outputted in response to a control signal inputted from an external circuit of a semiconductor memory device and a method therefor.

In accordance with an aspect of the present invention, there is provided an apparatus for adjusting a slew rate in a semiconductor memory device, the apparatus including: a slew rate control signal generation block for outputting a plurality of slew rate control signals in response to control codes inputted from the external circuit in response to a command signal; and a data buffer for adjusting a slew rate of a data signal inputted by using the slew rate control signals.

In accordance with another aspect of the present invention, there is provided a method for adjusting a slew rate of a data signal outputted from a semiconductor memory device, including the steps of: combining a plurality of control code groups inputted from an external circuit through being controlled by a command signal to thereby generate a plurality of slew rate control signal groups; and selectively adjusting a slew rate of a data signal depending on a shifted logic state of the data signal outputted to a data pad by using the slew rate control signal groups.

In accordance with still another aspect of the present invention, there is provided a method for adjusting a slew rate of a data signal outputted from a semiconductor memory device, including the steps of: combining individually a plurality of control code groups inputted from an external circuit through being controlled by a command signal inputted from the external circuit to thereby generate a first slew rate control signal group and a second slew rate control signal group; adjusting the number of switches turned on within a first slew rate adjustment unit for adjusting a slew rate of the data signal outputted to a data pad by using the first slew rate control signal group; and adjusting the number of switches turned on within a second slew rate adjustment unit for adjusting a slew rate of the data signal outputted to the data pad by using the second slew rate control signal group.

In accordance with further aspect of the present invention, there is provided a semiconductor memory device, including: a cell region including a plurality of cells for storing data; a command and address control block for receiving a command and an address from an external circuit and interpreting the command and the address; a row decoder for decoding a row address by the address inputted from the command and address control block; a column decoder for decoding a column address by the address inputted from the command and address control block; a data input register for storing data inputted to one of cells corresponding to the row address and the column address; a data input buffer for transmitting data inputted from the external circuit to the data input register; a data output register for storing data outputted to one of the cells corresponding to the row address and the column address; a slew rate control signal generation block for generating a plurality of slew rate control signals by combining control codes inputted from the external circuit through being controlled by a command signal from the external circuit; and a data buffer for outputting the data to the external circuit by adjusting a slew rate of the data inputted from the data output register through the use of the slew rate control signals.

In one embodiment, a circuit for adjusting a slew rate in a semiconductor memory device includes a slew rate control signal generation block to output a plurality of slew rate control signals. A data buffer adjusts a slew rate of a data signal inputted by using the slew rate control signals. The data buffer includes an output driver to output the data signal, the output driver having a first switch, a second switch, and an output node provided between the first and second switches to output the data signal; a first pre-driver having a first transistor, a second transistor, and a first output node, the first output node being provided between the first and second transistors of the first pre-driver and being coupled to a first control terminal of the first switch, the first transistor of the first pre-driver being coupled to a voltage supply; a second pre-driver having a first transistor, a second transistor, and a second output node, the second output node being provided between the first and second transistors of the second pre-driver and being coupled to a second control terminal of the second switch, the first transistor of the second pre-driver being coupled to the voltage supply; and a first slew rate adjustment unit coupled to the second transistor of the first pre-driver via the first node, the first flew rate adjustment unit having a plurality of components and configured to provide variable resistance to adjust the slew rate of the data signal. The components of the first slew rate adjustment unit include first, second, and third resistors coupled in series and provided between the first node and the ground. A first transistor of the first slew rate adjustment unit is coupled between the first and second resistors. A second transistor of the first slew rate adjustment unit is coupled between the second and third resistors. The resistance of the first slew rate adjustment unit is varied by controlling at least the first and second transistors.

BRIEF DESCRIPTION OF THE DRAWINGS

The nature and advantages of the present invention will become better understood with reference to the following description of the preferred embodiments and the accompanying drawings, in which.

DETAILED DESCRIPTION OF THE INVENTION

Hereinafter, an apparatus for adjusting a slew rate in a semiconductor memory device and a method therefor in accordance with preferred embodiments of the present invention will be described in detail with reference to the accompanying drawings.

Figure 4:
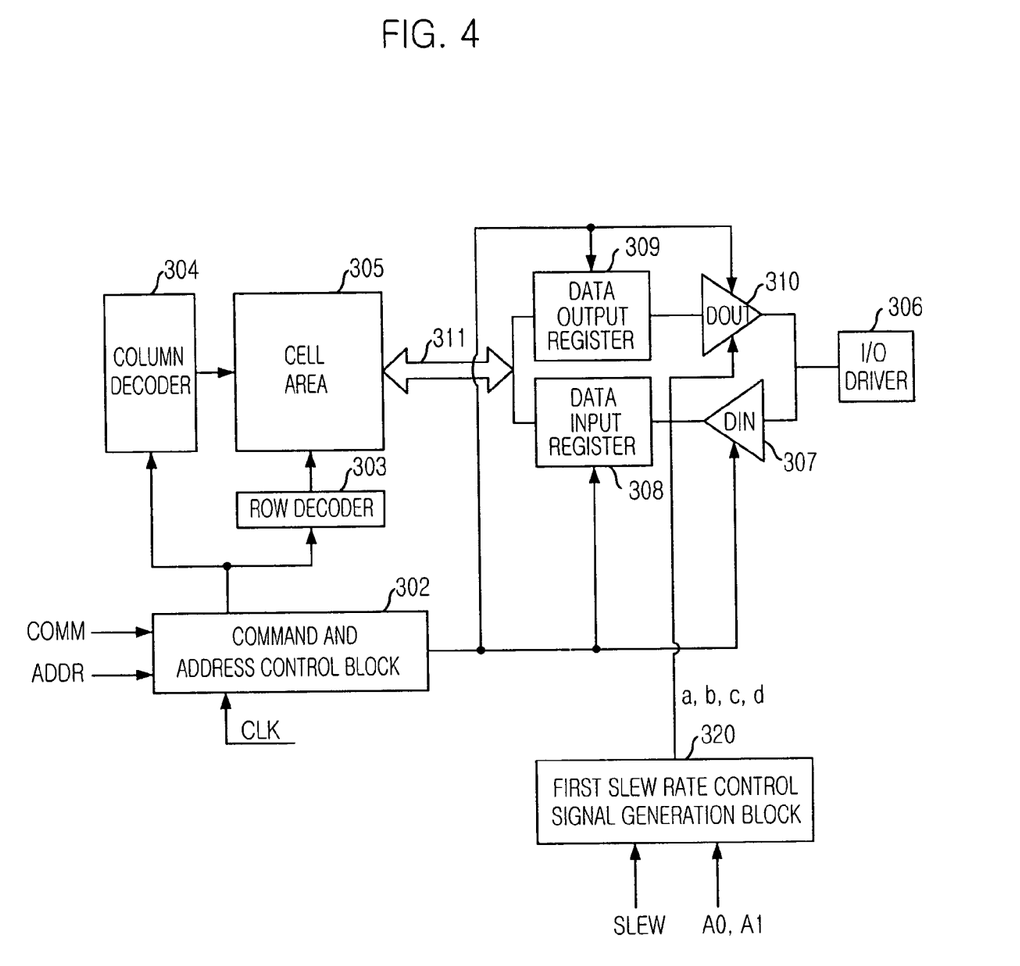
FIG. 4 is a block diagram of a semiconductor memory device in accordance with a first embodiment of the present invention.

FIG. 4 is a block diagram of a semiconductor memory device in accordance with a first embodiment of the present invention. The semiconductor memory device includes: a command and address control circuit 302; a row decoder 303; a column decoder 304; a memory cell array or area 305; an input/output driver 306; a data input buffer 307; a data input register 308; a data output register 309; and a first data output buffer 310.

The command and address control circuit 302 receives a command COMM and an address ADDR and transmits the address to the row decoder 303 and to the column decoder 304. Also, the command and address control circuit 302 controls the row decoder 303, the column decoder 304, the data input buffer 307, the data input register 308, the data output register 309, and the first data output buffer 310 in response to the inputted command COMM.

The cell area 305 includes a plurality of memory cells for storing a data and a plurality of sense amplifiers for amplifying data stored into the plurality of memory cells. The row decoder 303 and the column decoder 304 select a memory cell to be read and written in response to the command COMM and the address ADDR inputted from an external circuit. Herein, the command COMM includes a plurality of instructions responsible for a row access and a column access in operation of a dynamic random access memory (DRAM) device. Examples of such instructions are a row address strobe (RAS) signal, a column address strobe (CAS) signal and a write enable (WE) signal. Likewise, the address ADDR includes a row address and a column address for accessing a memory cell.

Hereinafter, reading and writing operation of the semiconductor memory device will be described in detail. Once the RAS signal is activated, a row address is inputted. The row address is then decoded by the row decoder 303, and a plurality of the memory cells corresponding to the decoded row address are activated. A data having a low potential stored into the activated memory cells is amplified by the sense amplifiers of the cell area 305. The sense amplifiers are ready for a read operation or a write operation after amplifying the accessed data, i.e., the data stored within the activated memory cells. That is, the sense amplifiers can serve as a data cache for temporarily storing data.

Figure 5:
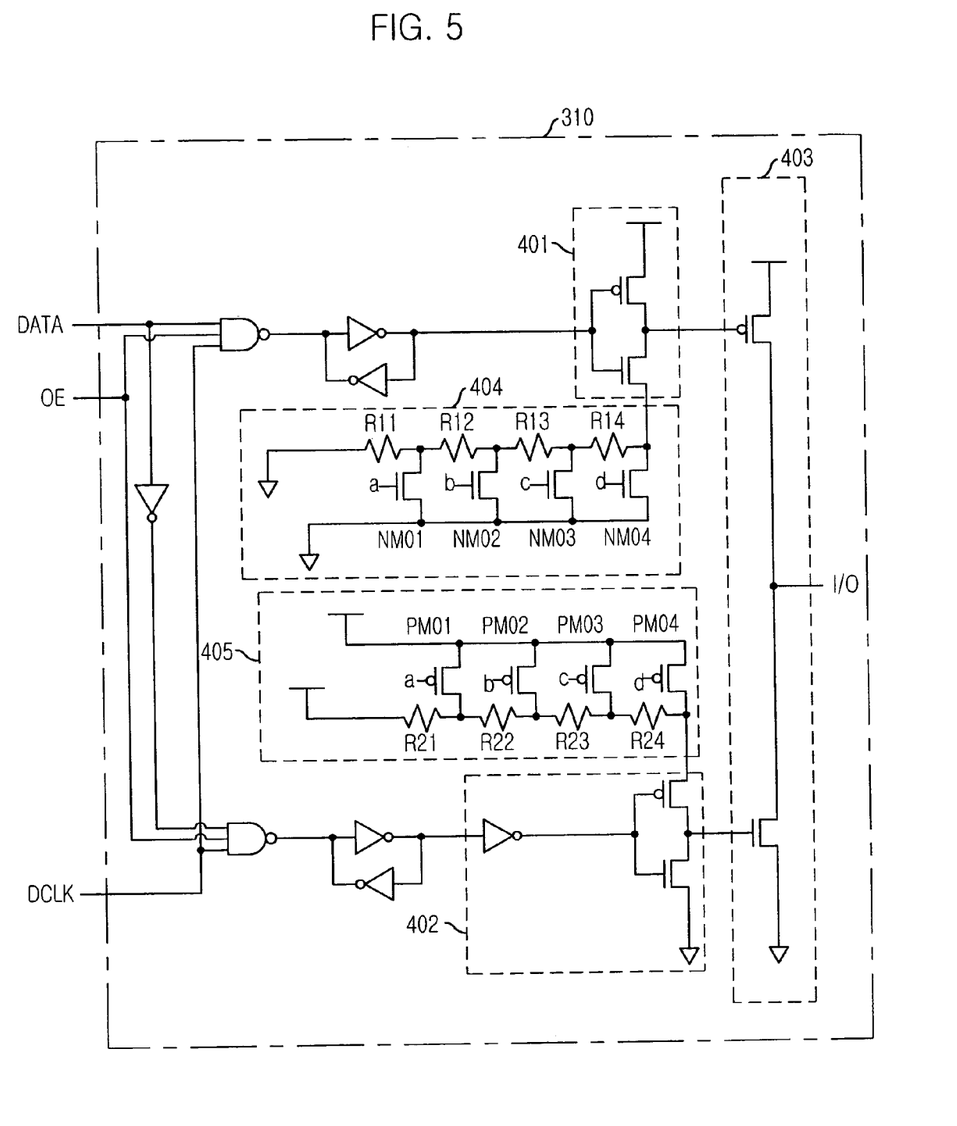
FIG. 5 is a schematic circuit diagram showing an exemplary implementation for data output buffer shown in FIG. 4.
Figure 6:
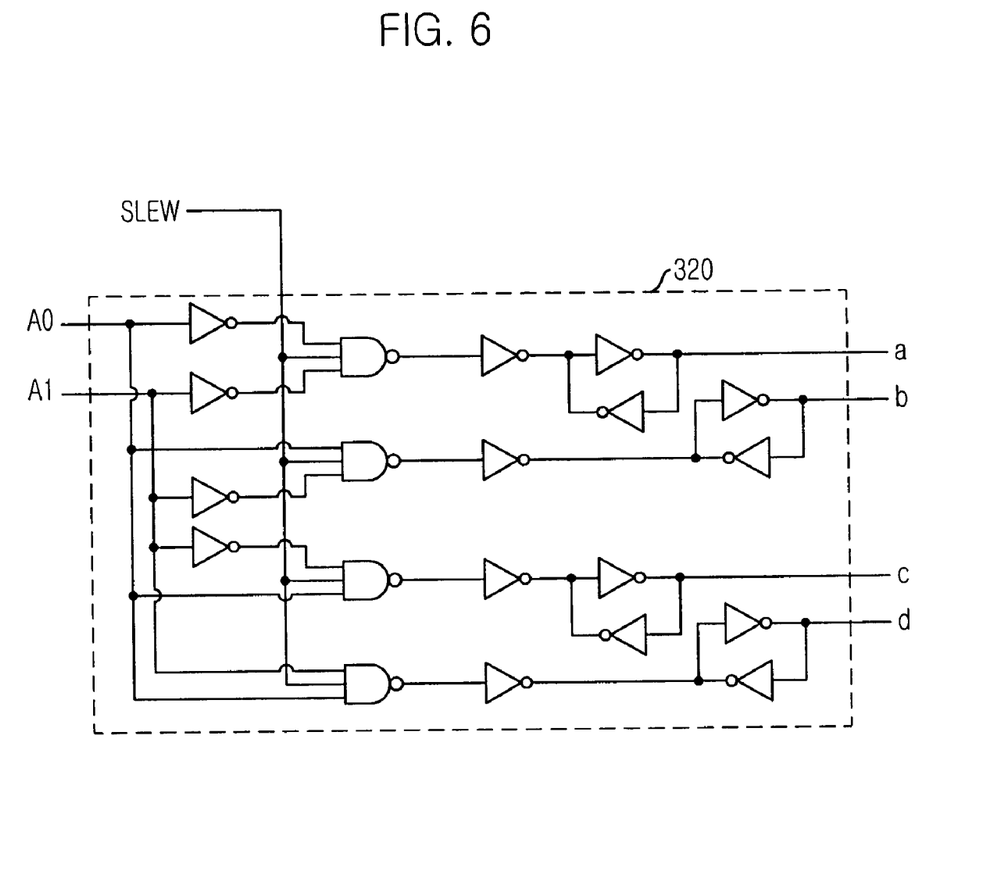
FIG. 6 is a schematic circuit diagram depicting an exemplary implementation for a first slew rate control signal generation block shown in FIG. 4.
Figure 7:
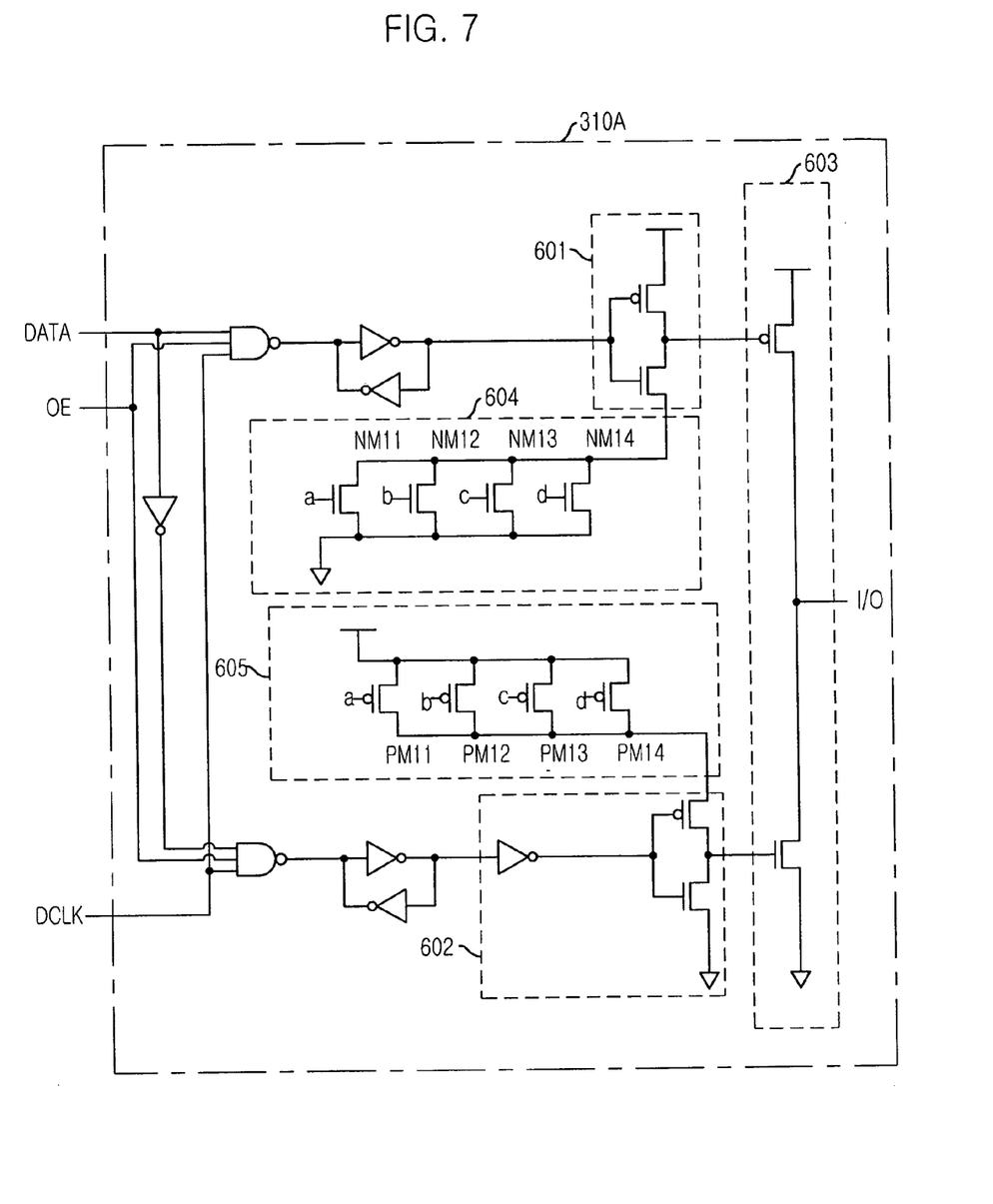
FIG. 7 is a schematic circuit diagram depicting another exemplary embodiment for data output buffer shown in FIG. 4.

The semiconductor memory device in accordance with the present invention further includes a first slew control signal generation block 320 for controlling a slew rate. Exemplary implementations for the first data output buffer 310 and the first slew rate control signal generation block 320 are illustrated in FIGS. 5 and 6, respectively. FIG. 5 is a schematic circuit diagram depicting an exemplary implementation for the first data output buffer 310 shown in FIG. 4, and FIG. 6 is a schematic circuit diagram depicting an exemplary implementation for the first slew rate control signal generation block 320 shown in FIG. 4. Also, FIG. 7 is a schematic circuit diagram of another exemplary embodiment of data output buffer 310A. Herein, data output buffer 310A will be referred to as a second data output buffer 310A.

As shown in FIG. 5, the first data output buffer 310 includes a first pre-driver 401, a second pre-driver 402, an output driver 403, a first slew rate adjustment unit 404, and a second slew rate adjustment unit 405. The output driver 403 for finally outputting a data has a first metal oxide semiconductor (MOS) transistor and a second MOS transistor. The first MOS transistor and the second MOS transistor are controlled by the first pre-driver 401 and the second pre-driver 402 each being connected with a respective gate. Also, the first pre-driver 401 and the second pre-driver 402 are connected with the first slew rate adjustment unit 404 and the second slew rate adjustment unit 405, respectively.

The first slew rate adjustment unit 404 and the second slew rate adjustment unit 405 have a plurality of devices for adjusting a slew rate. Each of the first slew rate adjustment unit 404 and the second slew rate adjustment unit 405 is for adjusting the slew rate depending on control signals a, b, c and d inputted for adjusting the slew rate.

In more detail, as shown in FIG. 5, the first slew rate adjustment unit 404 has a first group of resistors R11, R12, R13 and R14 being connected in series and determining a slew rate and a first group of MOS transistors NM01 to NM04. The second slew rate adjustment unit 405 has a second group of resistors R21, R22, R23 and R24 being connected in series and determining a slew rate and a second group of MOS transistors PM01 to PM04. The first group of resistors R11, R12, R13, and R14 and the second group of resistors R21, R22, R23, and R24 are individually controlled by switching devices that receive the control signals a, b, c and d, i.e., the first group of MOS transistors NM01 to NM04 and the second group of MOS transistors PM01 to PM04. Herein, the switching devices can be constituted in NMOS transistors and PMOS transistors activated or inactivated depending on the control signals.

Hereinafter, sequential steps for adjusting the slew rate will be described. First, one of the control signals a, b, c and d inputted to the first slew rate adjustment unit 404 and to the second slew rate adjustment unit 405 is activated into a logic high 'H' state. Then, the first slew rate adjustment unit 404 and the second slew rate adjustment unit 405 have variable resistances. Thus, electrical current flowing to the first pre-driver 401 and to the second pre-driver 402 is also variable. This variable electric current circuit that drivability of the first pre-driver 401 and the second pre-driver 402 increases or decreases. As the resistance value becomes greater, the slew rate decreases, and conversely, as the resistance value decreases, the slew rate increases. Through this manner, the slew rate is adjusted. If the slew rate measured during the operation is similar to the waveform shown in FIG. 3A, the control signals a, b, c and d adjusting the slew rate are programmed to obtain the waveform similar to the waveform shown in FIG. 3B.

The control signals a, b, c and d inputted to the first slew rate adjustment unit 404 and to the second slew rate adjustment unit 405 are signals generated as a result of the decoding of two control codes A0 and A1 inputted to the first slew rate control signal generation block 320. Also, the decoding operation is determined when an external command A0 and A1 on the slew rate adjustment is inputted.

Also, instead of using the plurality of resistors connected in series, the slew rate can be adjusted by changing sizes of the transistors. As shown in FIG. 7, a plurality of transistors NM11 to NM14 and PM11 to PM14 connected in parallel respectively within a third slew rate adjustment unit 604 and a fourth slew rate adjustment unit 605 can be used. That is, electric current flow to a third pre-driver 601 and to a fourth pre-driver 602 changes depending on the number of transistors activated by the control signals a, b, c and d, and as a result, drivability of the third pre-driver 601 and the fourth pre-driver 602 can be increased or decreased. An exemplary circuit implementation for the first slew rate control signal generation block 320 necessary for generating the control signals a, b, c and d is depicted in FIG. 6. The operation of the first slew rate control signal generation block 320 is readily understood by those ordinary people skilled in the art.

Although FIG. 7 shows the case of employing four control signals and four switching devices, this number of the control signals and the switching devices is one exemplary case. Depending on needs, the number of the control signals and that of the switching devices can be greater than or less than this exemplary number. The number of the control signals and that of the switching devices are preferably greater than approximately 10.

Figure 8:
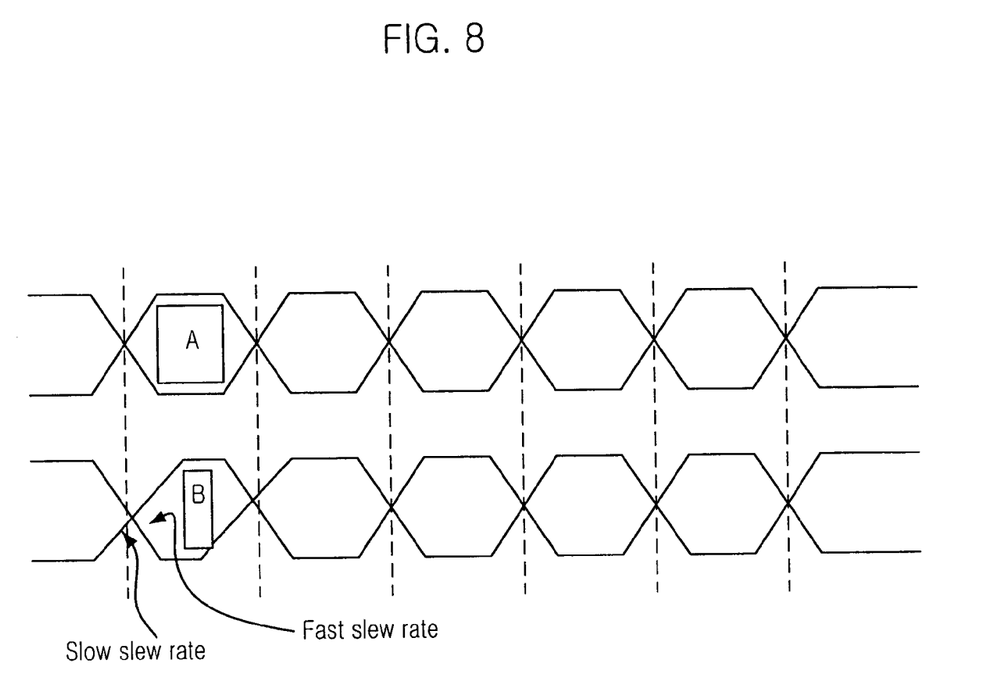
FIG. 8 shows waveforms illustrating a difference in slew rates depending on an output data.

According to schemes of adjusting the slew rate described in FIGS. 5 and 7, the slew rate can be varied based on a logic state of a data signal transmitted through a data pad. That is, there may exist a difference in current driving speed because of characteristics of the PMOS transistors and the NMOS transistors within the first slew rate adjustment unit 404 and the second slew rate adjustment unit 405 or within the third slew rate adjustment unit 604 and the fourth slew rate adjustment unit 605 for adjusting the slew rate of a data in a logic high "H" state to a logic low "L" state and that of a data in a logic low "L" state to a logic high "H" state. Thus, there may be a problem that the slew rates are not exactly coherent with each other. For instance, as shown in FIG. 8, a rising operation for the logic high "H" data converted from the logic low "L" data has a very slow slew rate and a falling operation for the logic low "L" data converted from the logic high "H" data has a very fast slew rate, a data window will become narrower. A reference denotation 'B' expresses this narrowed data window.

Figure 9:
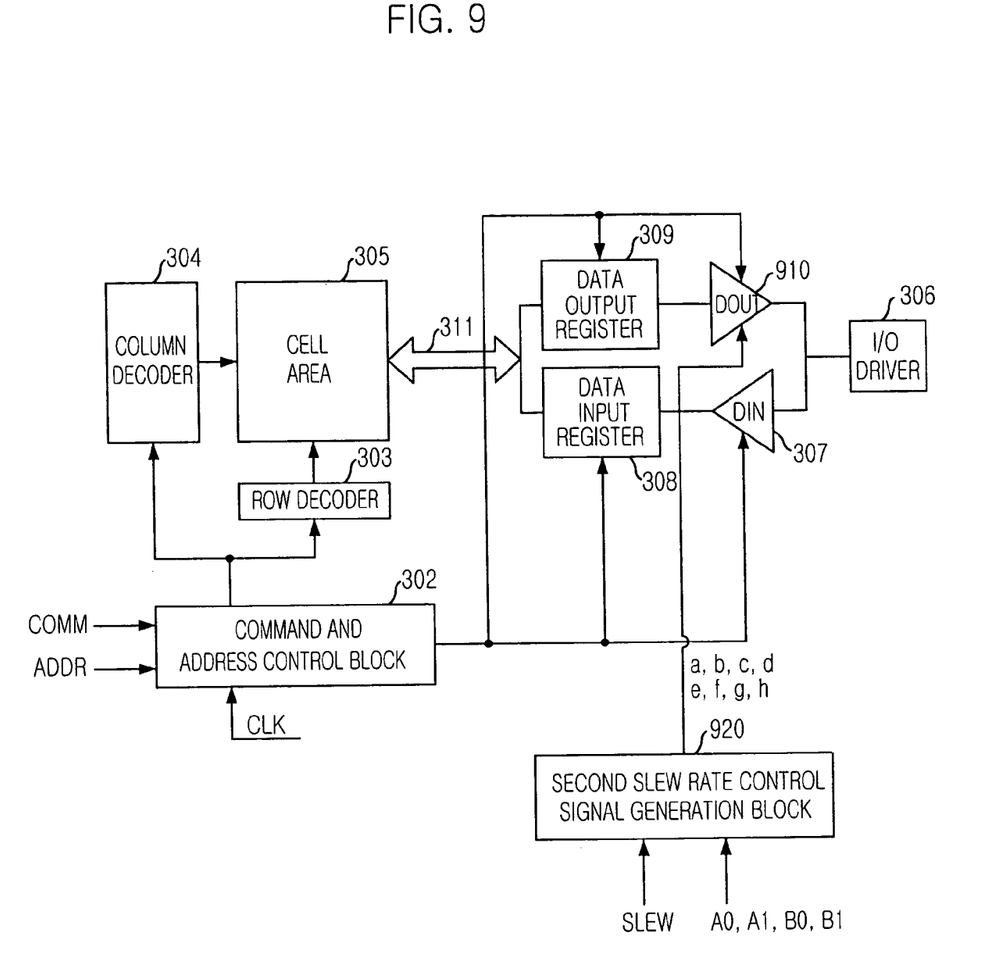
FIG. 9 is a block diagram depicting a semiconductor memory device in accordance with a second embodiment of the present invention.

FIG. 9 is a block diagram showing a semiconductor memory device in accordance with a second embodiment of the present invention. Most of configuration elements shown in FIG. 9 are similar to those shown in FIG. 4. Thus, for the same configuration elements, the same reference numerals used in FIG. 4 will be used in this drawing.

The semiconductor memory device shown in FIG. 9 is different from that shown in FIG. 4 in that four control codes A0, A1, B0 and B2 are inputted to a second slew rate control signal generation block 920 to thereby output eight slew rate control signals a to h and a third data output buffer 910 is inputted with the eight slew rate control signals a to h.

Figure 10:
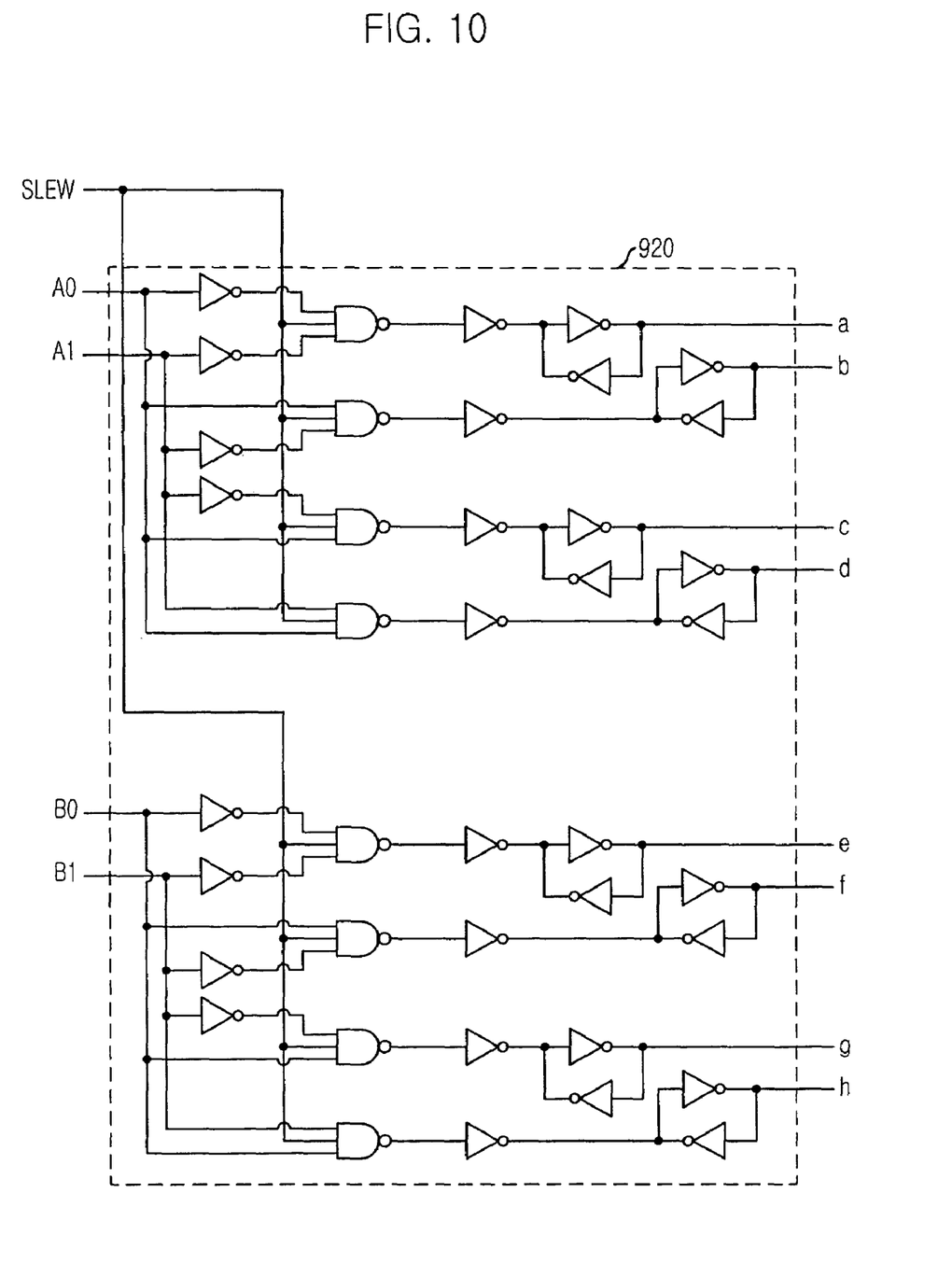
FIG. 10 is a circuit diagram showing a second exemplary implementation for a slew rate control signal generation block shown in FIG. 9.
Figure 11:
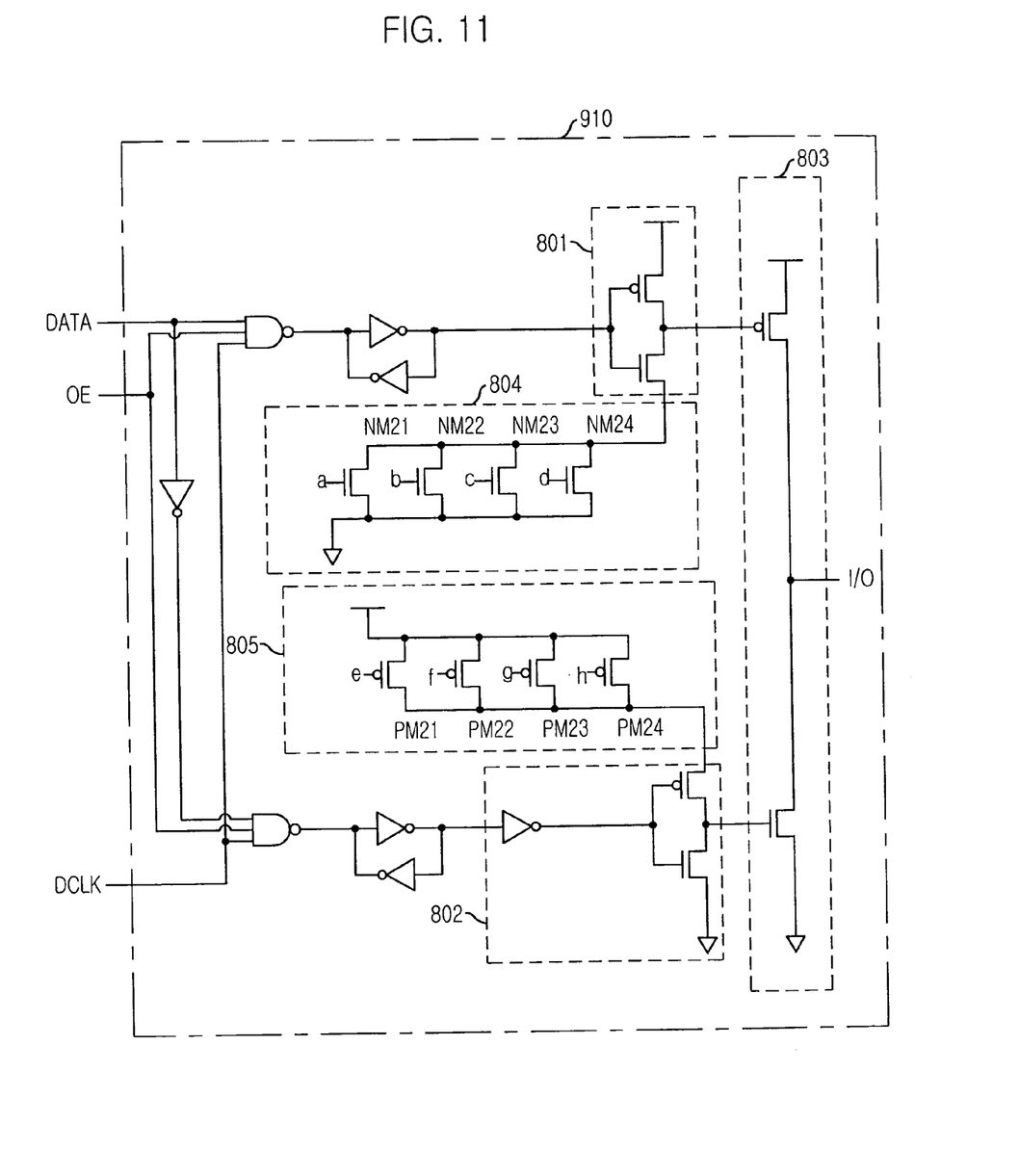
FIG. 11 is a circuit diagram of an exemplary embodiment for output buffer shown in FIG. 9.
Figure 12:
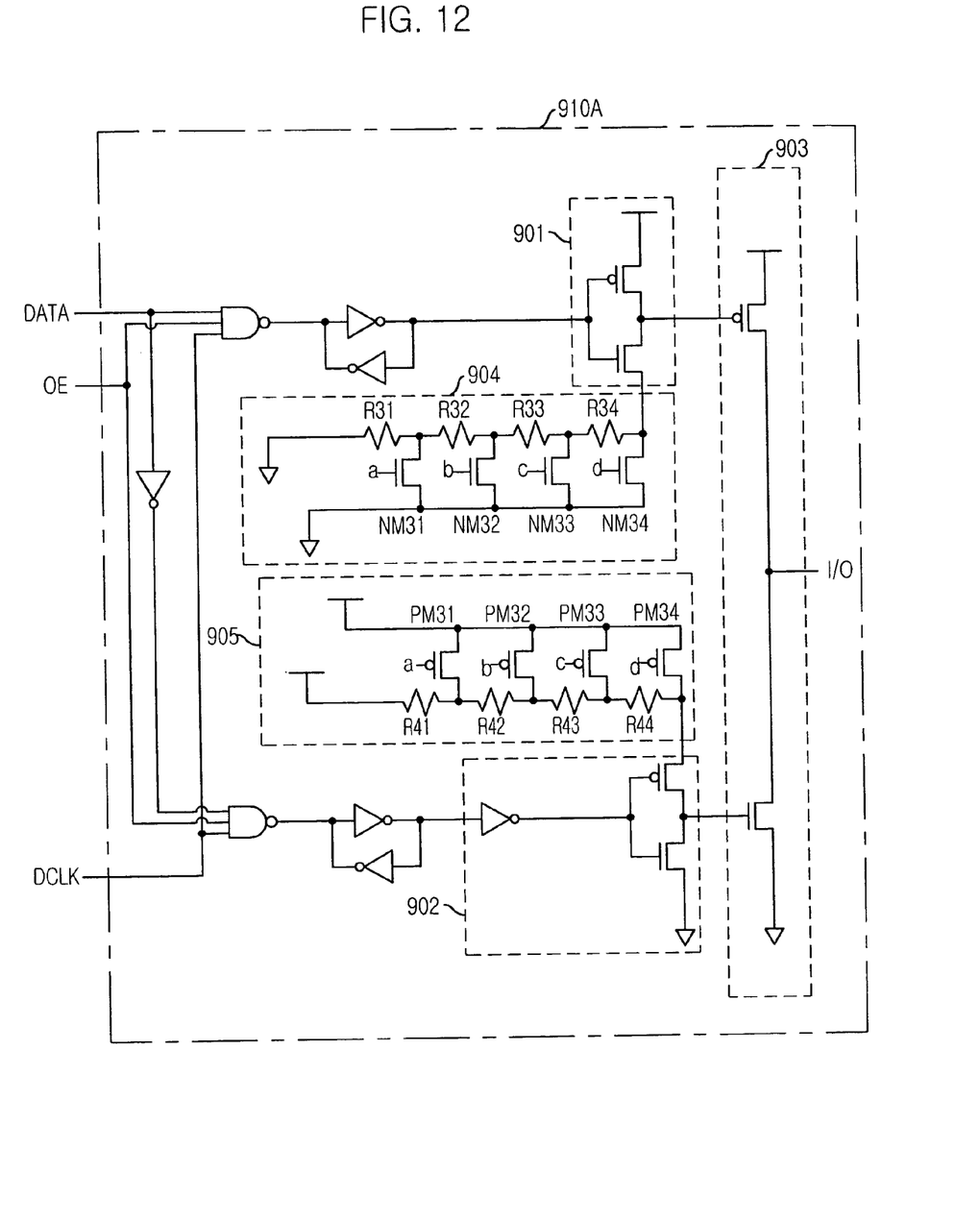
FIG. 12 is a circuit diagram of another exemplary embodiment for data output showing in FIG. 9.

FIG. 10 is a circuit diagram depicting the second slew rate control signal generation block 920 in accordance with the second embodiment of the present invention. FIGS. 11 and 12 show the differently embodied third and fourth data output buffers 910 and 910A in accordance with the second embodiment of the present invention.

As shown in FIG. 10, one slew rate command signal SLEW and the above mentioned four control codes A0, A1, B0 and B1 are inputted to the second slew rate control signal generation block 920. Hereinafter, the four control codes A0, A1, B0 and B1 will be expressed particularly as a first control code A0, a second control code A1, a third control code B0 and a fourth control code B1.

According to the slew rate command signal SLEW, the first control code signal A0 and the second control code A1 activate at least more than one slew rate control signal among a first group of slew rate control signals a to d. Similarly, according to the command signal on the slew rate, the third control code B0 and the fourth control code B1 activate at least more than one slew rate control signal among a second group of slew rate control signals e to h.

The third data output buffer 910 shown in FIG. 11 is different from the first data output buffer 310 shown in FIG. 4. That is, the slew rate control signals inputted to a fifth slew rate adjustment unit 804 and to a sixth slew rate adjustment unit 805 are different from each other. Therefore, the number of switches turned on within the fifth slew rate adjustment unit 804 and within the sixth slew rate adjustment unit 805 can be varied. Eventually, it is possible to overcome the limitation in fabrication of differently characterized PMOS transistors and NMOS transistors that supply currents in response to an output of a logic high "H" data and that of a logic low "L" data. For instance, since a current driving speed of the PMOS transistor is fast while that of the NMOS transistor is slow, a data signal for outputting the logic high "H" data can be adjusted to be slow and a data signal for outputting the logic low "L" data can be adjusted to be fast. As a result of the adjustment, as shown in FIG. 8, it is possible to obtain a wide data window A by varying the number of the switches turned on within the fifth slew rate adjustment unit 804 and the sixth slew rate adjustment unit 805.

The fifth slew rate adjustment unit 804 and the sixth slew rate adjustment unit 805 include a group of NMOS transistors NM21 to NM24 connected in parallel and a group of PMOS transistors PM21 to PM24 connected in parallel, respectively. As a result of this configuration, the sizes of the transistors can be adjusted, thereby adjusting the slew rate. That is, depending on the number of the activated control signals a to h, drivability of a fifth pre-driver 801 and a sixth pre-driver 802 can be increased or decreased.

For instance, as like the fourth data output buffer 910A shown in FIG. 12, a plurality of resistors R31 to R34 and R41 to R44 are connected in series, and a group of NMOS transistors NM31 to NM34 connected in parallel individually with a first set of the resistors R31, R32, R33 and R34 and a group of PMOS transistors PM31 to PM34 connected in parallel individually with a second set of the resistors R41, R42, R43 and R44 are controlled to be turned on or turned off to vary resistances. Hence, an amount of current can be changed, thereby allowing the slew rate of the data signal to be adjusted. It should be noted that the switching devices employed for controlling the slew rate are not limited to the above NMOS and PMOS transistors.

As shown in FIGS. 10 to 12, the individual slew rate adjustment unit has four of the control signals and four of the switching devices. However, depending on need, the number of switching devices can be increased or decreased.

In accordance with the present invention, the slew rate of the data output signal can be selectively adjusted by a signal inputted from an external circuit even if a quality of the data signal is not good due to several causes, e.g., a process change. Thus, it is possible to obtain an optimum signal quality regardless of a system bus condition. Especially, since the slew rate is adjusted selectively corresponding to a characteristic of a device employed for the slew rate adjustment unit. As a result of this effect, a data window can be optimized. Also, since the slew rate can be externally adjusted through a software program, it is possible to flexibly adjust the slew rate even in the application of a system requiring a different slew rate.

The present application contains subject matter related to the Korean patent application Numbers KR 2003-93702 and KR 2004-22541, filed in the Korean Patent Office on Dec. 19, 2003 and on Apr. 1, 2004, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for adjusting a slew rate in a semiconductor memory device, the apparatus comprising:
a slew rate control signal generation block for outputting a plurality of slew rate control signals through combining control codes inputted from an external circuit in response to a command signal; and
a data buffer for adjusting a slew rate of a data signal inputted by using the slew rate control signals,
wherein the control codes are classified into a first control code group and a second control code group,
wherein the slew rate control signal generation block includes:
a first slew rate control signal generator for outputting a first slew rate control signal group by decoding the first control code group through the use of the command signal; and
a second slew rate control signal generator for outputting a second slew rate control signal group by decoding the second control code group through the use of the command signal,
wherein the data buffer includes:
a first pre-driver for generating a driving signal with use of the inputted data signal;
a first slew rate adjustment unit for adjusting a slope of the data signal by the first slew rate control signal group, the first slew rate adjustment unit being connected between one side of the first pre-driver and one of a ground and a supply voltage;
an output driver for outputting the data signal with use of the driving signal;
a second pre-driver for generating a driving signal with use of the inputted data signal; and
a second slew rate adjustment unit for adjusting a slope of the data signal by the second slew rate control signal group, the second slew rate adjustment unit being connected between one side of the second pre-driver and one of a ground and a supply voltage.

2. The apparatus as recited in claim 1, wherein said at least one slew rate adjustment unit includes a plurality of slew rate adjustment devices.

3. The apparatus as recited in claim 2, wherein the slew rate adjustment devices are resistors.

4. The apparatus as recited in claim 3, wherein said at least one slew rate adjustment unit includes:
plurality of resistors connected in series between one side of said at least one pre-driver and one of a ground and a supply voltage; and
a plurality of switching devices connected in parallel for electrically connecting a partial number or a whole number of the plurality of resistors with each other through being controlled by the plurality of slew rate control signals.

5. The apparatus as recited in claim 4, wherein the slew rate control signal generation block decodes the control codes by the command signal.

6. The apparatus as recited in claim 2, wherein the plurality of slew rate adjustment devices are switching devices.

7. The apparatus as recited in claim 6, wherein said at least one slew rate adjustment unit includes a plurality of switching devices connected in parallel between one side of said at least one pre-driver and one of a ground and a supply voltage and the slew rate control signals make a partial number or a whole number of the plurality of switching devices electrically connected with each other.

8. The apparatus as recited in claim 7, wherein the switching devices are metal oxide semiconductor (MOS) transistors.

9. The apparatus as recited in claim 1, wherein each of the first slew rate adjustment unit and the second slew rate adjustment unit includes a plurality of slew rate adjustment devices.

10. The apparatus as recited in claim 9, wherein the plurality of slew rate adjustment devices are resistors.

11. The apparatus as recited in claim 1, wherein each of the first slew rate adjustment unit and the second slew rate adjustment unit includes:
a plurality of resistors connected in series between one side of the respective pre-driver and one of a ground and a supply voltage; and
a plurality of switching devices connected in parallel for electrically connecting a partial number or a whole number of the plurality of resistors with each other through the use of the respective slew rate control signal group.

12. The apparatus as recited in claim 9, wherein the slew rate adjustment devices are switching devices.

13. The apparatus as recited in claim 12, wherein each of the first slew rate adjustment unit and the second slew rate adjustment unit includes a plurality of switching devices connected in parallel between one side of the respective pre-driver and one of a ground and a supply voltage and the respective slew rate control signal group makes a partial number or a whole number of the plurality of switching devices electrically connected with each other.

14. The apparatus as recited in claim 13, wherein the switching devices are MOS transistors.

15. A circuit for adjusting a slew rate in a semiconductor memory device, the circuit comprising:
a slew rate control signal generation block to output a plurality of slew rate control signals; and
a data buffer to adjust a slew rate of a data signal inputted by using the slew rate control signals, the data buffer including:
an output driver to output the data signal, the output driver having a first switch, a second switch, and an output node provided between the first and second switches to output the data signal;
a first pre-driver having a first transistor, a second transistor, and a first output node, the first output node being provided between the first and second transistors of the first pre-driver and being coupled to a first control terminal of the first switch, the first transistor of the first pre-driver being coupled to a voltage supply;
a second pre-driver having a first transistor, a second transistor, and a second output node, the second output node being provided between the first and second transistors of the second pre-driver and being coupled to a second control terminal of the second switch, the first transistor of the second pre-driver being coupled to the voltage supply; and
a first slew rate adjustment unit coupled to the second transistor of the first pre-driver via a first node, the first flew rate adjustment unit having a plurality of components and configured to provide variable resistance to adjust the slew rate of the data signal,
wherein the components of the first slew rate adjustment unit include first, second, and third resistors coupled in series and provided between the first node and the ground, wherein a first transistor of the first slew rate adjustment unit is coupled between the first and second resistors, and a second transistor of the first slew rate adjustment unit is coupled between the second and third resistors, and wherein the resistance of the first slew rate adjustment unit is varied by controlling at least the first and second transistors.

16. The circuit of claim 15, further comprising:

a second slew rate adjustment unit provided between a second node coupled to the first transistor of the second pre-driver, the second slew rate adjustment unit having a plurality of components coupled to the second node and configured to provide variable resistance to adjust the slew rate of the data signal.

17. A circuit for adjusting a slew rate in a semiconductor memory device, the circuit comprising:

a slew rate control signal generation block to output a plurality of slew rate control signals; and a data buffer to adjust a slew rate of a data signal inputted by using the slew rate control signals, the data buffer including:

an output driver to output the data signal, the output driver having a first switch, a second switch, and an output node provided between the first and second switches to output the data signal;

a first pre-driver having a first transistor, a second transistor, and a first output node, the first output node being provided between the first and second transistors of the first pre-driver and being coupled to a first control terminal of the first switch, the first transistor of the first pre-driver being coupled to a voltage supply;

a second pre-driver having a first transistor, a second transistor, and a second output node, the second output node being provided between the first and second transistors of the second pre-driver and being coupled to a second control terminal of the second switch, the first transistor of the second pre-driver being coupled to the voltage supply; and a first slew rate adjustment unit coupled to the second transistor of the first pre-driver via a first node, the first flew rate adjustment unit having a plurality of components and configured to provide variable resistance to adjust the slew rate of the data signal, wherein the first slew rate adjustment unit includes a first line, a second line, and first and second transistors, the first and second transistors provided in parallel between the first and second lines, the first transistor of the first slew rate adjustment unit having a first terminal that is coupled to the first node, the first line being coupled to the first transistor and the ground, and wherein the first slew rate adjustment unit further includes a plurality of resistors provide on the first line and between the first and second transistors of the first slew rate adjustment unit, wherein the components includes the resistors.

18. The circuit of claim 17, further including:

a second slew rate adjustment unit provided between a second node coupled to the first transistor of the second pre-driver, the second slew rate adjustment unit having a plurality of components coupled to the second node and configured to provide variable resistance to adjust the slew rate of the data signal.

* * * * *